United States Patent
Hilbert et al.

(10) Patent No.: US 10,818,047 B2
(45) Date of Patent: Oct. 27, 2020

(54) ITERATIVE RECONSTRUCTION OF QUANTITATIVE MAGNETIC RESONANCE IMAGES

(71) Applicants: Tom Hilbert, Lausanne (CH); Tobias Kober, Lausanne (CH)

(72) Inventors: Tom Hilbert, Lausanne (CH); Tobias Kober, Lausanne (CH)

(73) Assignee: Siemens Healthcare GmbH, Erlangen (DE)

( * ) Notice: Subject to any disclaimer, the term of this patent is extended or adjusted under 35 U.S.C. 154(b) by 294 days.

(21) Appl. No.: 15/940,323

(22) Filed: Mar. 29, 2018

(65) Prior Publication Data
US 2018/0286088 A1 Oct. 4, 2018

(30) Foreign Application Priority Data
Apr. 3, 2017 (EP) .................................. 17164571

(51) Int. Cl.
*G06T 3/40* (2006.01)
*G06T 11/00* (2006.01)
(Continued)

(52) U.S. Cl.
CPC ........ *G06T 11/008* (2013.01); *G01R 33/4835* (2013.01); *G01R 33/5608* (2013.01);
(Continued)

(58) Field of Classification Search
CPC ................. G06T 11/008; G06T 3/4053; G06T 2211/424; G01R 33/4835; G01R 33/5611; G01R 33/56545; G01R 33/5608
See application file for complete search history.

(56) References Cited

U.S. PATENT DOCUMENTS 9,035,653 B2  5/2015 Hutter et al.
9,275,294 B2  3/2016 Chen et al.
(Continued)

FOREIGN PATENT DOCUMENTS

WO   2016171759 A1   10/2016

OTHER PUBLICATIONS

European Office Action dated Nov. 7, 2017, for corresponding EP Application No. 17164571.
(Continued)

*Primary Examiner* — Siamak Harandi
(74) *Attorney, Agent, or Firm* — Lempia Summerfield Katz LLC

(57) ABSTRACT

The disclosure includes a method for generating quantitative magnetic resonance (MR) images of an object under investigation. A first MR data set of the object under investigation is captured in an undersampled raw data space, wherein the object under investigation is captured in a plurality of 2D slices, in which the resolution in a slice plane of the slices is in each case higher than perpendicular to the slice plane, wherein the plurality of 2D slices are in each case shifted relative to one another by a distance which is smaller than the resolution perpendicular to the slice plane. Further MR raw data points of the first MR data set are reconstructed with the assistance of a model using a cost function which is minimized. The cost function takes account of the shift of the plurality of 2D slices perpendicular to the slice plane.

18 Claims, 3 Drawing Sheets

(51) Int. Cl.
G01R 33/56 (2006.01)
G01R 33/565 (2006.01)
G01R 33/561 (2006.01)
G01R 33/483 (2006.01)

(52) U.S. Cl.
CPC .... *G01R 33/5611* (2013.01); *G01R 33/56545* (2013.01); *G06T 3/4053* (2013.01); *G06T 2211/424* (2013.01)

(56) References Cited

U.S. PATENT DOCUMENTS 9,285,448 B2 3/2016 Hutter et al.
2014/0219531 A1* 8/2014 Epstein ............ G01R 33/56308
382/131

OTHER PUBLICATIONS

Van Steenkiste et al: "Super-resolution T1 estimation: Quantitative high resolution T1 mapping from a set of low resolution T1-weighted images with different slice orientations"; Magnetic Resonance in Medicine; Bd. 77; Nr. 5, pp. 1818-1830, (2017).

Greenspan H., et al. MRI inter-slice reconstruction using super-resolution, Magn. Reson. Imaging 2002; pp. 437-446, (2002).

Lu et al: "Super Resolution image reconstruction in parallel magnetic resonance imaging"; Control and Automation (ICCA); 2010 8th IEEE International Conference Piscataway; NJ; USA; pp. 761-766, (2010).

Jan Reeth et al: "Super-resolution in magnetic resonance imaging: A review"; Concepts in Magnetic Resonance Part A; Bd. 40A Nr. 6; pp. 306-325, (2002).

Ning et al: "A joint compressed-sensing and super-resolution approach for very high-resolution diffusion imaging"; Neuro Image Bd. 125; pp. 386-400, (2016).

Sumpf T. J., et.al.: "Model-Based Nonlinear Inverse Reconstruction for T2 Mapping Using Highly Undersampled Spin-Echo MRI", Journal of Magnetic Resonance Imaging, vol. 34, pp. 420-428, (2011).

Hilbert T., et al. "SAFT: Split-Algorithm for Fast T2 Mapping." ISMRM Singapore 2017.

* cited by examiner

ITERATIVE RECONSTRUCTION OF QUANTITATIVE MAGNETIC RESONANCE IMAGES

The application claims the benefit of European Patent Application No. EP 17164571.6, filed Apr. 3, 2017, which is hereby incorporated by reference in its entirety.

TECHNICAL FIELD

The present disclosure relates to a method for generating quantitative magnetic resonance (MR) images of an object under investigation and to the associated MR system for this purpose. A computer program product and an electronically readable data storage medium are furthermore provided.

BACKGROUND

Magnetic resonance tomography (MRT) is an inherently slow imaging technique which may involve long measurement times. MRT does, however, yield very usable image contrast. In particular, soft tissue contrast showing clinical information is well reproduced in MR images, as a result of which MR applications are in widespread clinical use. The contrast present in "normal" MR images is based on a combination of various physical parameters of the underlying tissue and the capture technique used. A blend of these factors determines the image contrast which is achieved.

A further possibility for obtaining contrast information from biological tissue involves measuring the underlying physical or physiological characteristics, (e.g., the T1 time, T2 time, or proton density). These techniques are known as parameter imaging or quantitative imaging. In this approach, the MR images produced are independent of the MR system used, the imaging technique applied, and the imaging parameters used. As a consequence, the different results may be better compared and clinical diagnosis is improved. Quantitative MR images open up the possibility of determining an absolute measure of the physical parameters used, so reducing dependency on image contrast, which depends on many different factors.

For example, quantitative measurement of the T2 relaxation time enables more accurate and reliable identification of clinically relevant disease processes, (e.g., neurodegenerative diseases or inflammation in the brain). Changes in the cartilage or pathological changes in cardiac muscle may also be better identified.

Although the use of quantitative MR images has been known for quite some time, they are only rarely routinely used in clinical practice, which is due inter alia to the following two problems:

Problem (a): Generating quantitative MR images may be very time-consuming. The generation of quantitative MR images conventionally involves fitting an analytical signal model to the captured MR data in order to calculate the quantitative information such as the T2 or T1 time therefrom. A plurality of data points is, however, required if the fit is to function well. For example, quantitatively determining the T2 time entails capturing a plurality of spin echoes at different echo times in order to model the exponential signal curve of T2 time. This results overall in very long measurement times.

Problem (b): The spatial resolution achievable when generating quantitative MR images is limited. In two-dimensional (2D) image acquisition, signal intensity falls when the slice thickness, (e.g., the spatial resolution perpendicular to the slice plane), is reduced, whereby signal noise in the image is increased. A further effect which has an impact on quantification is that the slice profiles of the excited 2D slices in thinner layers are not perfectly rectangular, so in turn possibly giving rise to a measurement error. These effects have a negative impact on the fitting method and thus on the accuracy of the algorithm and of the MR parameters determined. Some quantitative MR image capture techniques, (e.g., a spin-echo sequence), are limited to 2D acquisitions and cannot be straightforwardly extended to three dimensions, such that it is not possible to increase the signal-to-noise ratio in this manner. Application to three-dimensional (3D) techniques is, for example, limited due to the specific absorption rate (SAR), because 3D applications would otherwise involve exposing tissue to excessive energy.

It has hitherto only been possible to solve one of the problems stated above in a) or b).

MR signals are captured in the "raw data space" or K-space and it is known that a certain volume of data is required if the images are to be reconstructed without artifacts (e.g., without aliasing artifacts). This condition is known as the Nyquist theorem. It is, however, possible for some of the captured MR data to be redundant and for other knowledge to be used in order to fill parts of the raw data space not with measured raw data, but instead with reconstructed raw data. One possibility for calculating raw data points in the case of incompletely captured raw data spaces involves using a model-based approach in which raw data points which were not captured may be reconstructed on the basis of the model. One example of such a method is known by the name MARTINI ("Model-based Accelerated Relaxometry by Iterative Non-linear Inversion"), which is an iterative image reconstruction method which uses a signal model. One example is described in Sumpf, Tilmann J, et al. "Model-based nonlinear inverse reconstruction for T2 mapping using highly undersampled spin-echo MRI," *Journal of Magnetic Resonance Imaging*, 34.2 (2011): 420-428. Monoexponential signal decay is, for example, here used as the knowledge for reconstructing unmeasured MR raw data points and determining a T2 value. The signal-to-noise ratio may be reduced if the raw data space is incompletely captured. This loss in the signal-to-noise ratio reduces the possibility of achieving high resolution when generating the quantitative MR images. A possible problem of the kind stated above in a) is thus solved, but the problem stated in b) is increased.

Other iterative image reconstruction methods are described, for example, in U.S. Pat. No. 9,275,294 B2, U.S. Pat. No. 9,285,448 B2 and U.S. Pat. No. 9,035,653 B2.

Spatial resolution may be increased in 2D captures by varying the pulse bandwidth and/or amplitude of the slice selection gradients in order to reduce slice thickness. As a result, however, fewer spins are excited, so reducing the amplitude of the received signal and thus resulting in a lower signal-to-noise ratio. For this reason, the slice thickness in conventional 2D image capture techniques is 2 mm or more. Higher resolutions are possible with 3D image capture techniques in which non-selective high frequency (HF) pulses are used in order to excite an excitation volume that is a number of cm in thickness. These non-selective HF pulses excite all the spins in the measuring field, which results in an elevated signal and thus in an elevated signal-to-noise ratio. These non-selective HF pulses do, however, expose the object under investigation to very high levels of energy, such that prevailing limits for SAR values in humans are exceeded. When generating 3D quantitative T2 images using the conventional spin-echo technique, these SAR limit values are relatively quickly reached because large tilt angles are used in the HF pulses, as a result of which the body is exposed to a high level of energy.

Alternatively, "super-resolution reconstructions" are available, as described, for example, in Greenspan H, et al. in "MRI inter-slice reconstruction using super-resolution" in *Magn. Reson. Imaging*, 2002; 20: 437-446. In such a method, a plurality of 2D slices with a low resolution are captured perpendicular to the slice plane, wherein each slice is slightly shifted perpendicular to the slice plane relative to the other slices. The overlapping slices are combined to produce MR images with a higher resolution in the slice direction, e.g., perpendicular to the slice plane. It is also possible to produce high-resolution T1 parameter images in this manner. While this technique does indeed remedy the technical problem of low spatial resolution, the measurement time is lengthened and therefore the problem stated in above in a) is not solved because this measurement time is up to 30 min for generating quantitative MR images.

SUMMARY AND DESCRIPTION

The scope of the present disclosure is defined solely by the appended claims and is not affected to any degree by the statements within this description. The present embodiments may obviate one or more of the drawbacks or limitations in the related art.

It is an object of the present disclosure to solve the above-stated problems, in particular simultaneously to solve the problems stated above in a) and b), namely that quantitative MR images may be generated with satisfactory resolution in the slice direction and a capture time which is not excessively long.

A first aspect provides a method for generating quantitative MR images of an object under investigation, wherein a first MR data set of the object under investigation is captured in an undersampled raw data space which according to the Nyquist condition is incompletely filled with raw data points. The object under investigation is captured in a plurality of 2D slices, in which the resolution in a slice plane of the slices is in each case higher than perpendicular to the slice plane and wherein the plurality of 2D slices are in each case shifted relative to one another by a distance which is smaller than the resolution perpendicular to the slice plane. Furthermore, further MR raw data points which were not captured are reconstructed for the first MR data set, wherein reconstruction proceeds with the assistance of a model using a cost function which is minimized and in which the captured raw data points are compared with the reconstructed raw data points which were not captured. The cost function now takes account of the shift of the plurality of 2D slices relative to one another. A high-resolution MR data set which has a higher resolution perpendicular to the slice plane than the plurality of 2D slices is determined on the basis of the first MR data set and the further MR raw data points. The quantitative MR images are determined using the high-resolution MR data set.

In this proposed method, a model-based reconstruction is combined with the technique in which the 2D slices are captured shifted relative to one another by a distance. The cost function used during modeling furthermore takes account of this shift of the 2D slices relative to one another, such that it is possible to determine the reconstructed MR raw data points which were not captured with high accuracy. Both the problems stated above in a) and b) are solved, namely the measurement time is shortened by using undersampled MR data which is, for example, undersampled by a factor of between 5 and 10. The improved resolution furthermore solves the problem stated above in b), such that the generated quantitative MR images also have a satisfactory resolution in this direction which is similar to the resolution in the slice plane.

The slices may be shifted relative to one another perpendicular to the slice direction, wherein the slices are located parallel to one another. Rotation of the individual slices or other shifts are, however, also possible.

In the above-stated method, an estimated high-resolution MR data set that has a higher resolution perpendicular to the slice plane than the first MR data set may be estimated. Furthermore, the resolution of the estimated high-resolution MR data set is reduced in order to generate an estimated low-resolution MR data set having the same resolution perpendicular to the slice plane as the first MR data set. The estimated low-resolution MR data set may be compared with the first MR data set and the cost function may be minimized, wherein the difference between the estimated low-resolution MR data set and the first MR data set is minimized.

In the model, using the estimated high-resolution MR data set and the subsequent reduction in resolution and subsequent comparison with the captured first MR data set, it is possible to establish how good the estimated high-resolution MR data set is. By minimizing the difference between the estimated low-resolution MR data set and the first MR data set, it is possible to obtain a good estimate of the estimated high-resolution MR data set.

The cost function which is minimized in the model may include a data consistency term which provides a model of the capture of the first MR data set. This data consistency term now has a term which takes account of the plurality of 2D slices in each case having been shifted relative to one another by a distance perpendicular to the slice plane. For example, the cost function and in this case the data consistency term may include a shift operator which describes the shift of the plurality of 2D slices by the distance.

The cost function may furthermore include a signal curve term which describes or models how the MR signal behaves during capture of the first MR data set as a function of the selected imaging sequence. This signal curve term may additionally be taken into account during minimization of the cost function.

The cost function may additionally include an image term which takes account of or models the object under investigation shown in the MR images having a small number of edges. This is, for example, justified when generating quantitative MR image data of the brain, because only a small number of edges are present beyond the skullcap.

The cost function may now be minimized in an iterative method, wherein in a first pass of the iterative method only the data consistency term is minimized without using the signal curve term and the image term. A first high-resolution MR data set may be determined in a first pass of the iterative method and used in the second pass in the signal curve term and image term in order to minimize these two terms.

The image term may involve carrying out a wavelet transformation in order to obtain the edge map. Coefficients corresponding to a threshold value are removed from this edge map before the inverse wavelet transformation is carried out.

The image term and signal curve term may furthermore in each case be weighted in the cost function with a coefficient, wherein the coefficients indicate how heavily weighted the image term and the signal curve term are in the cost function.

The disclosure likewise relates to the associated MR system which includes a computing unit and a memory unit, wherein the memory unit stores information executable by the computing unit and the MR system is configured, on execution of the control information in the computing unit, to carry out the above-described acts and the acts yet to be described in detail below.

A computer program product with a program is furthermore which may be loaded directly into a memory unit of the programmable computing unit of the MR system in order to carry out the above-stated acts when the program is executed in the computing unit. An electronically readable data storage medium with electronically readable control information stored thereon is furthermore provided, which information is configured in such a way that, on using the data storage medium in the computing unit of the MR system, it carries out the above-described method.

The above-described features and the features described below may be used not only in the corresponding explicitly explained combinations but also in further combinations, unless explicitly stated otherwise.

BRIEF DESCRIPTION OF THE DRAWINGS

The disclosure is explained below in greater detail with reference to the appended drawings.

DETAILED DESCRIPTION

Figure 1:
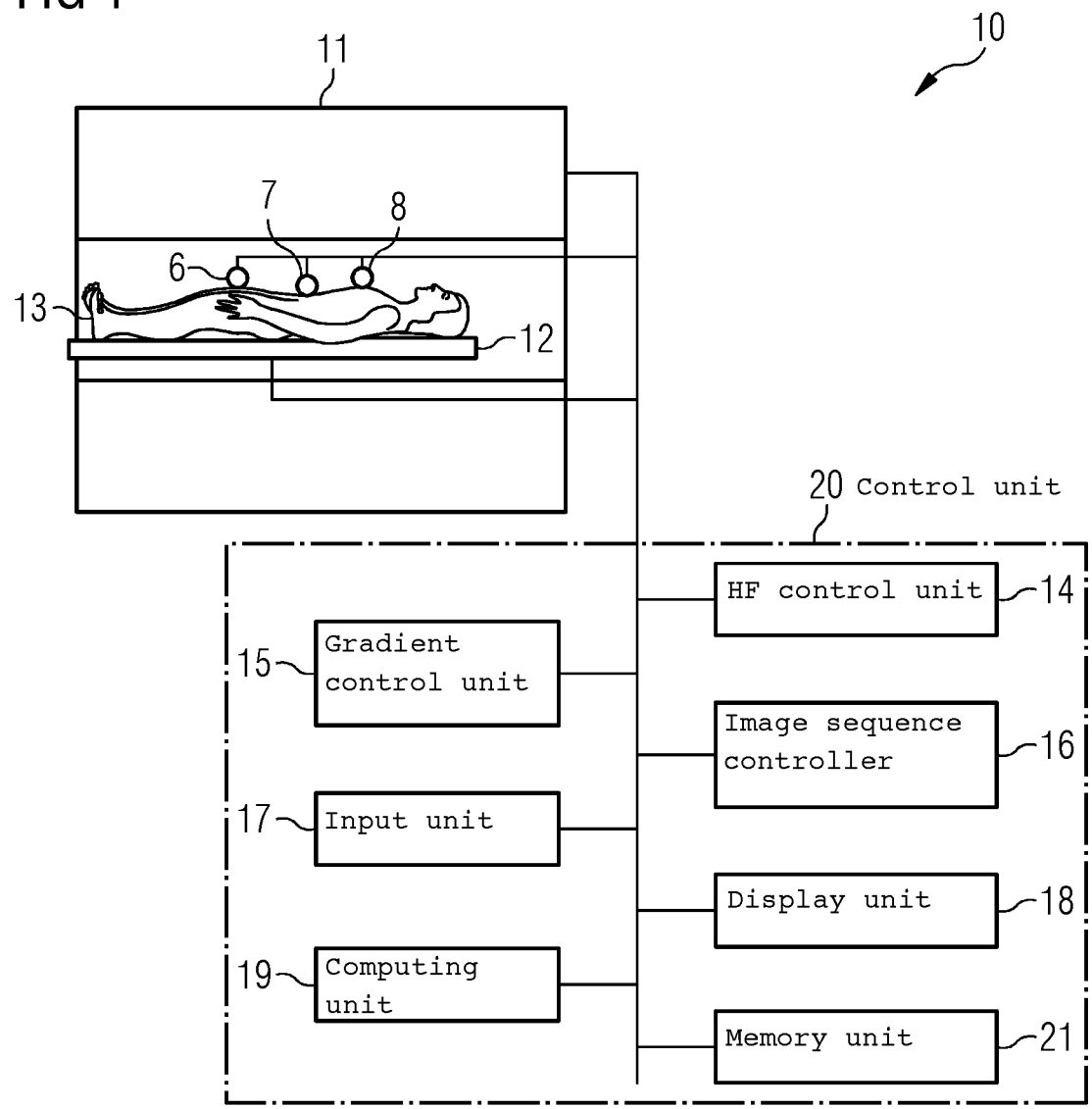
FIG. 1 is an example of a schematic diagram of an MR system with which quantitative MR images may be calculated.

The present disclosure is described in greater detail below on the basis of certain embodiments with reference to the appended drawings. Identical or similar elements are labeled with the same reference signs in the drawings. The figures are furthermore schematic diagrams of various embodiments of the disclosure. The elements illustrated in the figures are not necessarily shown true to scale but are instead reproduced in such a way that their function and purpose are comprehensible to a person skilled in the art. The connections between functional units and other elements shown in the figures may also be implemented as indirect connections with the connection being wireless or wired. Functional units may be implemented as hardware, software, or a combination of hardware and software.

FIG. 1 illustrates an MR system 10 with which, as is explained below, quantitative MR images may be captured with good spatial resolution in all dimensions and within a satisfactory capture duration.

The MR system 10 includes a magnet 11 for generating a polarization field B0, wherein a person under investigation 13 is arranged on a couch 12 is advanced into the magnet 11 for the purpose of capturing spatially encoded magnetic resonance signals from the person under investigation. The coils 6, 7, and 8 used for signal capture may be used for transmitting HF pulses and for receiving the MR signals. An optionally present whole-body coil of the MR system 10 is not shown for reasons of clarity. The magnetization generated by the polarization field B0 may be deflected from the equilibrium position and spatially encoded by applying high-frequency pulses and switching magnetic field gradients and the resultant magnetization is detected by the receive coils 5-8. The manner in which MR images may be produced by applying the HF pulses and switching magnetic field gradients in various combinations and sequences is known in principle to a person skilled in the art and is not explained in any greater detail here.

The MR system furthermore includes a control unit 20 which may be used for controlling the MR system. The control unit 20 includes a gradient control unit 15 for controlling and switching the necessary magnetic field gradients. An HF control unit 14 is provided for controlling and generating the HF pulses for deflecting the magnetization out of the equilibrium position. An image sequence controller 16 controls the sequence of magnetic field gradients, HF pulses and signal selection and thus also indirectly controls the gradient control unit 15 and the HF control unit 14. An operator may control the MR system via an input unit 17, while MR images and other information required for control may be displayed on a display unit 18. A computing unit 19 with one or more processor units is provided for controlling the individual functional units. Program modules or programs may be stored in a memory unit 21 which, when executed on the computing unit 19 or the processing unit thereof, are capable of controlling the running of the MR system. The computing unit 19 may in particular be configured in such a way that quantitative MR images are calculated by an iterative method from the captured MR signals, as will be explained below in relation to FIGS. 2 and 3.

Figure 2:
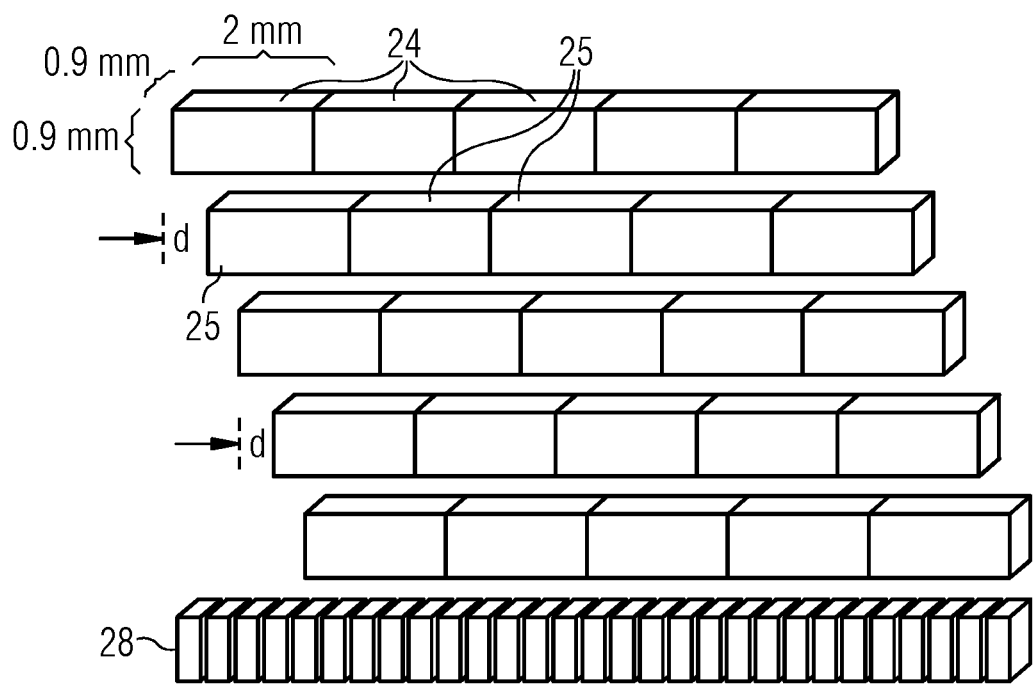
FIG. 2 is an example of a schematic diagram of the shifting of the 2D slices for producing a high-resolution MR data set with a higher resolution in the slice direction.
Figure 3:
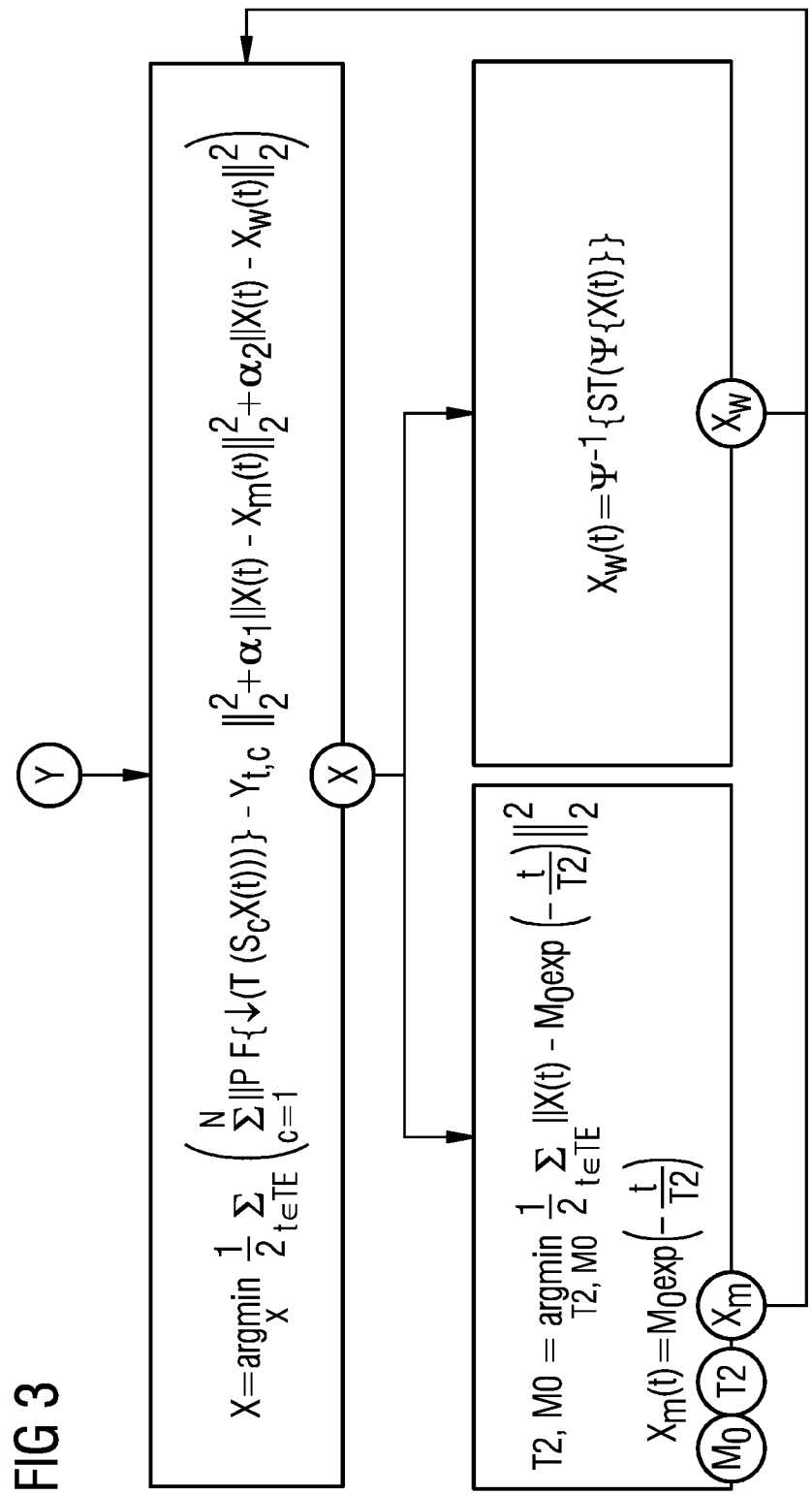
FIG. 3 is an example of a schematic diagram of a sequence diagram with the acts for iterative calculation of the quantitative MR image data.

FIG. 2 depicts diagrammatically how a data set which has a higher resolution perpendicular to the slice direction may be produced from a plurality of 2D slices which are offset relative to one another. FIG. 2 depicts voxels 24 of captured MR image data, wherein the slices lie parallel to one another and have a greater resolution in the slice plane than perpendicular to the slice plane. This means that the pixels are smaller in size in the slice plane than perpendicular to the slice direction. FIG. 2 depicts various voxels 24 of 2D slices which lie parallel to one another with a slice thickness of, for example, 2 mm. In the slice plane, the voxel has, for example, a resolution of 0.9×0.9 mm.

This plurality of 2D slices with the voxels 24 are now shifted by a distance D in the slice direction, (e.g., by 0.4 mm), so giving rise to the position of the voxels 25 as shown. This act may be repeated, in the case shown five times, whereby a high-resolution MR image data set 28 is obtained which has a higher resolution than the MR data set which was measured. The captured MR data set with the voxels 24 or 25, hereinafter also denoted first MR data set, is captured with a high level of undersampling, (e.g., with five times, seven times, or ten times undersampling). Quantitative MR images may now be reconstructed as explained in greater detail in relation to FIG. 3. A high-resolution MR data set, an image data set, is estimated which is hereinafter also designated estimated high-resolution MR data set. This high-resolution estimated MR data set X is estimated by minimizing a modeling function which is described below as equation (1).

$$X = \underset{x}{\operatorname{argmin}} \frac{1}{2} \sum_{t \in TE} \left( \sum_{c=1}^{N} \|PF\{\downarrow(T(S_c X(t)))\} - Y_{t,c}\|_2^2 + \alpha_1 \|X(t) - X_m(t)\|_2^2 + \alpha_2 \|X(t) - X_m(t)\|_2^2 \right) \quad (1)$$

In equation (1) above, X is the high-resolution MR data set, Y denotes the captured first MR data set with low resolution, wherein the coil sensitivities are denoted S. The operator T denotes the shift of the slices between the captures by the distance d as explained in FIG. 2.

T describes a shift operator which defines the shift of the plurality of 2D slices by the distance. The down arrow means that an estimated low-resolution MR data set is prepared from the high-resolution MR data set as was obtained by the shift perpendicular to the slice plane, which estimated low-resolution data set is compared with the measured MR data Y, the first MR data set. F is Fourier transformation and P the undersampling mask. $\alpha_1$ and $\alpha_2$ are factors with which the signal curve term, which is described below, and the image term, which is likewise described in greater detail, are in each case respectively weighted. Because the estimated high-resolution MR data set is as yet unknown on a first pass through the iteration, $\alpha_1$ and $\alpha_2$ are set to zero in the first pass. After a first pass, a first estimate of the high-resolution MR data set is obtained. Fourier transformation is used to transform said data set into the K space for comparison with Y. When this estimated high-resolution MR data set has been estimated a first time in the first pass, the signal curve term and the image term may respectively be calculated with the following equations (2) and (3).

$$T2, M0 = \underset{T2, M0}{\mathrm{argmin}}\, \frac{1}{2} \sum_{t \in TE} \left\| X(t) - M_0 \exp\left(-\frac{t}{T2}\right) \right\|_2^2 \quad (2)$$

$$X_m(t) = M_0 \exp\left(-\frac{t}{T2}\right) \quad (3)$$

The signal curve term models the signal curve of the MR signal as a function of the imaging sequence used. In the case shown, "T2 parameter images" are produced, such that equations (2) and (3) describe the monoexponential decay of T2 time after excitation of the magnetization. In the case of calculating a T1 map, the corresponding known signal curves for determining T1 time are used in said equations (2) and (3). Equations (2) and (3) thus yield the variable $M_0$, the equilibrium magnetization, T2 time and $X_m$, wherein $X_m$ corresponds to the signal curve in the imaging sequence used. $X_m$ is calculated by fitting a monoexponential decay onto X, which leads to the estimate of T2 time and of equilibrium magnetization $M_0$.

Furthermore, after the first pass, the image term may be calculated. The image term takes account of the object under investigation shown in the MR images having only a small number of edges, as is, for example, the case in the tissue within the brain and within the cranium. This second term describes the "sparsity" of the captured MR data.

$$X_w(t) = \Psi^{-1}\{ST(\Psi\{X(t)\})\} \quad (4)$$

$X_w$, the regularized image, is calculated by applying a wavelet transformation, wherein a soft threshold value ST is applied to the wavelet-transformed image. Applying this threshold value results in removal of wavelet coefficients so giving rise to the desired "sparsity". Subsequently, the remaining wavelet coefficients are converted back into the image space with an inverse wavelet transformation in order to obtain an estimate $X_w$ which corresponds to "sparsity".

After calculating the images $X_m$ and $X_w$, these values may be used in each further iteration in equation (1) to calculate the high-resolution image data set X. By selecting $\alpha_1$ and $\alpha_2$, it is possible to define how heavily the "signal curve term" or "image term" may be weighted, (e.g., $\alpha_1=0.9$ and $\alpha_2=0.2$). The iteration may be repeated, for example, a defined number of repeats which is between 30 and 70. It is furthermore possible for the iteration to be repeated until the difference between the results of the iteration in the images is less than a limit value.

The cost function may be minimized by using a "Conjugate Gradient Descent" algorithm which is a numerical method for solving equation systems.

The result of the simulation is a high-resolution MR data set, an image data set, which may be used for calculating T2 times; the T2 times and associated parameter images may be calculated as usual.

As was explained above, the "super-resolution" method with the shift perpendicular to the slice plane was directly integrated into the cost function of the model-based reconstruction because both the undersampled acquisition process and the combination of the first MR data set with the high-resolution MR data set are taken into account. As a result, quantitative MR images may be determined in good resolution and in an acceptable capture time. The capture time is within an acceptable order of magnitude because the MR data is greatly undersampled. Reconstruction is improved by additionally taking account of the signal curve in the signal curve term. The problem described in the above equations may be solved by iterative reconstruction. The described model is a non-linear, non-convex optimization problem. The proposed separation and individual optimization of the individual terms provides rapid convergence of the optimization problem.

In the above-described embodiment, the method was used for determining quantitative T2 images. As already mentioned, the described method may, however, also be used for calculating other quantitative MR parameters, (e.g., for calculating T1, T2*times, diffusion, magnetization transfer, myelin water content, the size of the polarization field B0, or the radio frequency fields B1), wherein the signal curve term is adapted as a function of the variable to be quantified. In the case shown, a shift in slice direction was used as a modification of the visual field. Alternatively, other shift directions or rotations may be used in order to arrive at the high-resolution MR data set from the first low-resolution MR data set. The operator T is adapted accordingly to the shift used. In the described embodiment, the operation of the image term was a soft limit value in the wavelet region. Alternatively, the image term may also be omitted or further image terms may be used, (e.g., variants which are known by the name Total Variation, Low-Rank, or Tikonov).

The above-described division into the three different terms is not necessarily required for optimization and other algorithms, such as the Gaussian-Newtonian optimization algorithm or a method which is known by the name "Golden Section Search", may be used for optimization.

It is to be understood that the elements and features recited in the appended claims may be combined in different ways to produce new claims that likewise fall within the scope of the present disclosure. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present disclosure has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for generating quantitative magnetic resonance (MR) images of an object under investigation, in which a quantitatively determined MR parameter is represented, the method comprising:
   capturing a first MR data set of the object under investigation in an undersampled raw data space in a plurality of parallel 2D slices, which according to a Nyquist theorem is incompletely filled with captured raw data points, wherein a resolution in a slice plane of the plurality of parallel 2D slices is in each case higher than perpendicular to the slice plane, wherein each 2D slice of the plurality of parallel 2D slices is shifted relative to one another in a slice direction perpendicular to the slice plane by a distance smaller than the resolution perpendicular to the slice plane;
   reconstructing further raw data points of the first MR data set, which were not captured, with assistance of a model using a cost function that is minimized and in which the captured raw data points are compared with the reconstructed raw data points that were not captured, wherein the cost function takes account of the shift of the plurality of parallel 2D slices perpendicular to the slice plane;
   determining a high-resolution MR data set based on the first MR data set and the further raw data points, wherein the high-resolution MR data set has a higher resolution perpendicular to the slice plane than the resolution of the plurality of parallel 2D slices; and
   determining the quantitative MR images using the high-resolution MR data set.

2. The method of claim 1, further comprising:
   estimating an estimated high-resolution MR data set having a higher resolution perpendicular to the slice plane than a resolution of the first MR data set;
   reducing the resolution of the estimated high-resolution MR data set in order to generate an estimated low-resolution MR data set having a same resolution perpendicular to the slice plane as the resolution of the first MR data set;
   comparing the estimated low-resolution MR data set with the first MR data set; and
   minimizing the cost function, wherein a difference between the estimated low-resolution MR data set and the first MR data set is minimized.

3. The method of claim 2, wherein the cost function comprises a data consistency term that provides a model of the capture of the first MR data set, and
   wherein the data consistency term takes account of the 2D slices of the plurality of parallel 2D slices in each case being shifted relative to one another by the distance perpendicular to the slice plane.

4. The method of claim 2, wherein the cost function comprises a signal curve term that describes how a MR signal behaves during the capture of the first MR data set, and
   wherein the signal curve term is taken into account during the minimization of the cost function.

5. The method of claim 2, wherein the cost function comprises an image term that takes account of a sparsity prerequisite being met in the MR images.

6. The method of claim 2, wherein the cost function comprises a shift operator that describes the shift of the plurality of parallel 2D slices by the distance.

7. The method of claim 5, wherein a wavelet transformation is carried out in the image term, and
   wherein a threshold value is applied in a transformed region before a wavelet back-transformation is carried out.

8. The method of claim 2, wherein the cost function comprises a signal curve term that describes how a MR signal behaves during the capture of the first MR data set and an image term that takes account of a sparsity prerequisite being met in the MR images,
   wherein the signal curve term and the image term are taken into account during the minimization of the cost function, and
   wherein the image term and the signal curve term are in each case weighted with a coefficient that indicates how heavily the image term and the signal curve term are respectively weighted in the cost function.

9. The method of claim 1, wherein the cost function comprises a signal curve term that describes how a MR signal behaves during the capture of the first MR data set, and
   wherein the signal curve term is taken into account during the minimization of the cost function.

10. The method of claim 4, wherein the cost function further comprises an image term that takes account of a sparsity prerequisite being met in the MR images,
    wherein the cost function further comprises a data consistency term that provides a model of the capture of the first MR data set, wherein the data consistency term takes account of the 2D slices of the plurality of parallel 2D slices in each case being shifted relative to one another by the distance perpendicular to the slice plane,
    wherein the signal curve term and the image term are individually minimized during the minimization of the cost function of the data consistency term.

11. The method of claim 10, wherein the cost function is minimized in an iterative method, wherein in a first pass only the data consistency term is minimized without using the signal curve term and the image term.

12. The method of claim 11, wherein a first high-resolution MR data set is determined in the first pass, and
    wherein the first high-resolution MR data set is used in a second pass in the signal curve term and the image term.

13. The method of claim 1, wherein the cost function comprises a shift operator that describes the shift of the plurality of parallel 2D slices by the distance.

14. The method of claim 13, wherein a wavelet transformation is carried out in an image term, and
    wherein a threshold value is applied in a transformed region before a wavelet back-transformation is carried out.

15. The method of claim 13, wherein an image term and a signal curve term are in each case weighted with a coefficient that indicates how heavily the image term and the signal curve term are respectively weighted in the cost function.

16. A magnetic resonance (MR) system configured to generate quantitative MR images of an object under investigation, in which a quantitatively determined MR parameter is represented, the MR system comprising:
    a computing unit; and
    a memory unit configured to store control information executable by the computing unit,
    wherein the MR system is configured, on execution of the control information in the computing unit, to at least perform:

capture a first MR data set of the object under investigation in an undersampled raw data space in a plurality of parallel 2D slices, which according to a Nyquist theorem is incompletely filled with captured raw data points, wherein a resolution in a slice plane of the plurality of parallel 2D slices is in each case higher than perpendicular to the slice plane, wherein each 2D slice of the plurality of parallel 2D slices is shifted relative to one another by a distance which is smaller than the resolution perpendicular to the slice plane;

reconstruct further raw data points of the first MR data set, which were not captured, with assistance of a model using a cost function that is minimized and in which the captured raw data points are compared with the reconstructed raw data points that were not captured, wherein the cost function takes account of the shift of the plurality of parallel 2D slices perpendicular to the slice plane;

determine a high-resolution MR data set based on the first MR data set and the further raw data points, wherein the high-resolution MR data set has a higher resolution perpendicular to the slice plane than the resolution of the plurality of parallel 2D slices; and determine the quantitative MR images using the high-resolution MR data set.

17. The MR system of claim 16, wherein the MR system is further configured to:

estimate an estimated high-resolution MR data set having a higher resolution perpendicular to the slice plane than a resolution of the first MR data set;

reduce the resolution of the estimated high-resolution MR data set in order to generate an estimated low-resolution MR data set having a same resolution perpendicular to the slice plane as the resolution of the first MR data set;

compare the estimated low-resolution MR data set with the first MR data set; and minimize the cost function, wherein a difference between the estimated low-resolution MR data set and the first MR data set is minimized.

18. An apparatus having a computer program product which comprises program code configured to be loaded directly into a memory unit of a programmable control unit of the apparatus, wherein the apparatus is configured, on execution of the program code, to at least perform:

capture a first MR data set of an object under investigation in an undersampled raw data space in a plurality of parallel 2D slices, which according to a Nyquist theorem is incompletely filled with captured raw data points, wherein the a resolution in a slice plane of the plurality of parallel 2D slices is in each case higher than perpendicular to the slice plane, wherein each slice of the plurality of parallel 2D slices is shifted relative to one another by a distance which is smaller than the resolution perpendicular to the slice plane;

reconstruct further raw data points of the first MR data set, which were not captured, with assistance of a model using a cost function that is minimized and in which the captured raw data points are compared with the reconstructed raw data points that were not captured, wherein the cost function takes account of the shift of the plurality of parallel 2D slices perpendicular to the slice plane;

determine a high-resolution MR data set based on the first MR data set and the further raw data points, wherein the high-resolution MR data set has a higher resolution perpendicular to the slice plane than the resolution of the plurality of parallel 2D slices; and determine quantitative MR images using the high-resolution MR data set.

* * * * *